(12) United States Patent
Ito

(10) Patent No.: US 8,748,057 B2
(45) Date of Patent: Jun. 10, 2014

(54) IONIC ELECTROLYTE MEMBRANE STRUCTURE, METHOD FOR ITS PRODUCTION AND SOLID OXIDE FUEL CELL MAKING USE OF IONIC ELECTROLYTE MEMBRANE STRUCTURE

(75) Inventor: Masahiro Ito, Chiba (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 811 days.

(21) Appl. No.: 12/706,169

(22) Filed: Feb. 16, 2010

(65) Prior Publication Data

US 2010/0239952 A1 Sep. 23, 2010

(30) Foreign Application Priority Data

Mar. 23, 2009 (JP) ................................. 2009/069741

(51) Int. Cl.
*H01M 8/10* (2006.01)
*B32B 3/26* (2006.01)

(52) U.S. Cl.
USPC ........... 429/495; 429/465; 429/479; 429/491; 429/529; 428/158; 156/77

(58) Field of Classification Search
None
See application file for complete search history.

(56) References Cited

U.S. PATENT DOCUMENTS

| 5,160,618 A * | 11/1992 | Burggraaf et al. | 210/490 |
| 2005/0020092 A1 | 1/2005 | Putkonen | 438/778 |
| 2007/0207357 A1* | 9/2007 | Ito | 429/30 |
| 2012/0040269 A1* | 2/2012 | Yates et al. | 429/482 |

OTHER PUBLICATIONS

Garcia-Barriocanal j et al., Colossal ionic conductivity at interfaces of epitaxial ZrO2:Y2O3/SrTiO3 heterostructures, Aug. 1, 2008, Science, vol. 321, pp. 676-680.*

J. Garcia-Barriocanal, et al.; "Colossal Ionic Conductivity at Interfaces of Epitaxial ZrO2:Y2O3/SrTiO3 Heterostructures;" Science; vol. 321; Aug. 1, 2008; pp. 676-680 (5 Sheets.)/p. 5.

Garcia-Barriocanal, J., et al., "Colossal Ionic Conductivity at Interfaces of Epitaxial ZrO2:Y2O3/SrTiO3 Heterostructures," Science, Aug. 1, 2008, vol. 321, No. 676, pp. 676-680.

European Search Report dated Jul. 7, 2010.

* cited by examiner

*Primary Examiner* — Barbara Gilliam
*Assistant Examiner* — Angela Martin
(74) *Attorney, Agent, or Firm* — Kratz, Quintos & Hanson LLP

(57) ABSTRACT

To provide an ionic electrolyte membrane structure that enables contact between the air pole and the fuel pole in which structure an edge face of the interface between an ion conducting layer and an ion non-conducting layer stands bare on a plane, an ionic electrolyte membrane structure which transmits ions only is made up of i) a substrate having a plurality of pores which have been made through the substrate in the thickness direction thereof and ii) a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate in such a way that the multi-layer membranes fill up the pores completely; the ions only being transmitted in the through direction by way of the multi-layer membranes provided on the inner wall surfaces of the pores.

8 Claims, 6 Drawing Sheets

US 8,748,057 B2

IONIC ELECTROLYTE MEMBRANE STRUCTURE, METHOD FOR ITS PRODUCTION AND SOLID OXIDE FUEL CELL MAKING USE OF IONIC ELECTROLYTE MEMBRANE STRUCTURE

BACKGROUND OF THE INVENTION

1. Field of the Invention

This invention relates to an ionic electrolyte membrane structure, a method for its production and a solid oxide fuel cell making use of the ionic electrolyte membrane structure.

2. Description of the Related Art

As our living standard becomes higher, they use electrical fittings in more various ways of living and come to prefer brighter rooms than ever, so that, correspondingly thereto, the consumption of electricity for lighting has been increasing. The consumption of electricity has also been increasing with a rise in the Internet connections and digital communications, making use of personal computers. However, in the present state of affairs, the construction of power plants or stations does not always turn out as desired, and the situation is that, in order to meet such increasing demand for electricity, the utilization of reproducible energy such as solar-cell electricity has to be taken into consideration.

It is difficult in the present state of affairs to construct large-scale power plants and also the loss in electricity during its transmission can not be ignored in conventional power generation and transmission systems. Accordingly, distributed (or on-site) power generation is considered to be of a great trend hereafter. A system in which solar cells are installed in homes to cover much of the home power consumption is considered to come to be an important way. The utilization of fuel cells making use of town gas or the like is also considered to come to be an important choice.

Now, there are various types in the fuel cells. In a polymer electrolyte fuel cell (hereinafter often also "PEFC"), which is a prevalent fuel cell at present, it necessitates water as an ancillary mechanism for the conduction of protons (hydrogen ions), and hence it is restricted to its use at 100° C. or below only. Its actual use is said to be at 80° C. or below, and the fuel cell has been found to have a limitation on how the heat be utilized and have a problem on its lifetime because a thin polymer layer is used as an electrolyte membrane.

Meanwhile, as a type considered optimal for users of medium-scale electricity as in homes, convenience stores and other various shops, a solid oxide fuel cell (hereinafter often also "SOFC") is available. The SOFC is basically made up of a solid electrolyte capable of transmitting ions selectively and, provided respectively on both sides thereof, two electrodes (an air pole and a fuel pole) holding the former between them. Then, oxygen is flowed through the air pole and hydrogen through the fuel pole whereby chemical reaction proceeds and electricity is generated. The electrolyte may at least be a material capable of transmitting either of oxygen ions and hydrogen ions. Usually, in view of restrictions on materials, the material capable of transmitting oxygen ions is used. Stabilized zirconia in which yttrium oxide is added to zirconium oxide so as to make its structure stable (hereinafter often also "YSZ") is used as the electrolyte material. Lanthanum manganite having perovskite structure and part of lanthanum of which has been substituted with an alkaline earth metal, $[La_{1-X}(M)_X]_Y MnO_3$ (M: an alkaline earth metal), is used for the air pole, and as the fuel pole, nickel zirconia cermet is used which is prepared by mixing YSZ with a stated amount of Ni.

As structure of the SOFC, what is known is a structure in which, as shown in FIG. 1, a single cell 40 made up of a solid electrolyte 41 and provided respectively on both sides thereof an air pole 42 and a fuel pole 43 is set in layers on an interconnector 44 having fuel passages 47 and oxidizing agent passages 48 and the electrolyte of which is provided with mechanical strength.

Such an SOFC is advantageous in view of lifetime because it makes use of an inorganic material for the electrolyte, and can utilize heat in virtue of its high service temperature, where its total efficiency is 50% or more, which exceeds the efficiency of about 35% the PEFC has. In addition, although the PEFC requires use of platinum as a catalyst, which is expensive, the SOFC, which is used at a high temperature of 200° C. or above, does not at all require use of any catalyst such as platinum, or makes it enough to use it in a smaller amount than any PEFC at least which is driven at room temperature. This is characteristic of the SOFC, thus the SOFC can be said to be superior in this respect as well, and is sought to be put into practical use.

In the conventional SOFC, as stated above the YSZ or the like is used as the electrolyte material and the conduction of oxygen ions is utilized, where, because of a low ionic conductivity, the fuel cell requires a certain degree of high temperature in order to secure any necessary ionic conductivity, and usually the electricity is generated at about 800° C. However, such a high temperature as service temperature may cause a great temperature difference in the interior of the fuel cell, and it has sometimes come about that this temperature difference causes the fuel cell to break due to a difference in thermal expansion.

As a countermeasure therefor, the SOFC must be made to slowly change in temperature over a period of many hours when it is started or stopped. Accordingly, the SOFC is considered not usable in homes and the like where its on-off is frequently repeated, and is considered suitable for its use in convenience stores and the like where the electricity is continuously used day and night. In addition, because of its use at a high temperature, it may break, besides its break due to the difference in thermal expansion, due to growth in size or change in shape of particles in the interior of its electrolyte membrane. Thus, in order to make an SOFC with a high energy efficiency usable in a broader range inclusive of its use in general homes, it is deemed to be a subject, for the above reasons, how the SOFC be made usable at a lower temperature. Hence, it is sought to develop a material having a high ionic conductivity even at 500° C. or below, or at much lower temperature, i.e., a temperature close to room temperature.

Now, as prior art, Non-patent Document 1 (J. Garcia-Barriocanal, A. Rivera-Calzada, M. Varela, Z. Sefrioui, E. Iborra, C. Leon, S. J. Pennycook, J. Santamarial; Science, 321 (2008) 676: "Colossal Ionic Conductivity At Interfaces Of Epitaxial $ZrO_2$: $Y_2O_3$/$SrTiO_3$ Heterostructures") discloses that, where the YSZ (8 mol % of $Y_2O_3$ is mixed) that has conventionally been available as an oxygen ion conductive material and an ion non-conductive material $SrTiO_3$ (hereinafter often simply "STO") are mutually layered, oxygen is conducted through the interface between the two layers and the fuel cell shows an ionic conductivity of as high as $1 \times 10^2$ S/cm even at about 200° C.

Usually, fuel cells are considered necessary for them to have an ionic conductivity of $1 \times 10^{-2}$ S/cm or more in a service temperature range, and hence, the above ionic conductivity of $1 \times 10^2$ S/cm can be said to be a sufficient ionic conductivity. Also, in the double-layer membrane proposed as above, it follows that, as long as ions are to be conducted by equal distance, the amount of ionic conduction more increases as the number of interfaces is made larger as far as possible. Then, in the above way of conduction, where such membranes are formed in laminae, the oxygen is conducted through the interior of interfaces between multiple layers, and therefore the ions are conducted in parallel to the membranes formed in laminae. However, in usual fuel cell electrolyte membranes or ion separation membranes, ions must be conducted in the direction perpendicular to the membranes, thus the double-layer membrane proposed as above is required to be structurally remedied in order for it to be put into practical use.

SUMMARY OF THE INVENTION

The present invention has been made taking note of such a problem. Accordingly, what it aims is to provide an ionic electrolyte membrane structure having a high ionic conductivity, a method for its production and a solid oxide fuel cell making use of the ionic electrolyte membrane structure.

In order to apply the way of conduction disclosed in Non-patent Document 1, an ion conducting layer composed of an ion conductive material and having a thickness of several atomic layers and an ion non-conducting layer composed of an ion non-conductive material and having a thickness of several atomic layers may be formed in laminae to make up a laminated membrane having a thickness in the order of centimeters, and this laminated membrane may be cut in the direction perpendicular to the plane of the laminated membrane to obtain a membrane lamination cross section that may facilitate ionic conduction, where ions may be conducted through between layers of this membrane lamination cross section (i.e., through the interior of interfaces between ion conducting layers and ion non-conducting layers), thus it may be possible to obtain an ionic electrolyte membrane having a high ionic conductivity. This, however, is impractical because it takes an astronomical time to form in laminae the ion conducting layer having a thickness of several atomic layers and the ion non-conducting layer having a thickness of several atomic layers to make up the laminated membrane having a thickness in the order of centimeters.

Accordingly, the present inventor has made extensive studies, and, as a result thereof, has discovered that an edge face of the interface between an ion conducting layer and an ion non-conducting layer (which edge face corresponds to the above membrane lamination cross section) may be made to stand bare on a plane without employing such a cutting method as above, to obtain an ionic electrolyte membrane structure that enables contact between the air pole and the fuel pole. Thus, the inventor has accomplished the present invention.

That is, the present invention first provides as a first embodiment an ionic electrolyte membrane structure which transmits ions only, comprising:

a substrate having a plurality of pores which have been made through the substrate in the thickness direction thereof; and a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate in such a way that the multi-layer membranes fill up the pores completely;

the ions only being transmitted in the through direction by way of the multi-layer membranes provided on the inner wall surfaces of the pores.

The present invention also second provides as a second embodiment an ionic electrolyte membrane structure which transmits ions only, comprising:

a united multi-layer membrane comprising an ion conducting layer formed of an ion conductive material and an ion non-conducting layer formed of an ion non-conductive material which have alternately been formed in laminae a plurality of times;

the united multi-layer membrane having been formed by:

bonding a substrate on one side thereof to a holding plate; the substrate being the substrate in the ionic electrolyte membrane structure according to the first embodiment, having the multi-layer membranes filling up the pores completely;

removing the substrate by dissolution to leave columnar multi-layer membranes to provide between the columnar multi-layer membranes an empty space extending through in the thickness direction of the structure to be formed; and alternately forming in laminae a plurality of times an ion conducting layer formed of an ion conductive material and an ion non-conducting layer formed of an ion non-conductive material on the inner wall surface of the empty space defined substantially by the columnar multi-layer membranes, serving as first multi-layer membranes, to form a second multi-layer membrane which fills up the empty space completely; the first multi-layer membranes and second multi-layer membrane having been united to form the united multi-layer membrane;

the ions only being transmitted in the through direction by way of the united multi-layer membrane formed.

The present invention still also third provides a method for producing the ionic electrolyte membrane structure according to the first embodiment, comprising:

on each inner wall surface of pores of a substrate having a plurality of pores which have been made through the substrate in the thickness direction thereof, alternately forming in laminae a plurality of times an ion conducting layer formed of an ion conductive material and an ion non-conducting layer formed of an ion non-conductive material, by atomic layer deposition (ALD) to form a plurality of multi-layer membranes which fill up the pores completely.

The present invention further fourth provides a method for producing the ionic electrolyte membrane structure according to the second embodiment, comprising:

bonding a substrate on one side thereof to a holding plate; the substrate being the substrate in the ionic electrolyte membrane structure according to the first embodiment;

removing the substrate by dissolution to leave columnar multi-layer membranes to provide between the columnar multi-layer membranes an empty space extending through in the thickness direction of the structure to be formed; and alternately forming in laminae a plurality of times an ion conducting layer formed of an ion conductive material and an ion non-conducting layer formed of an ion non-conductive material, by atomic layer deposition (ALD) on the inner wall surface of the empty space defined substantially by the columnar multi-layer membranes, serving as first multi-layer membranes, to form a second multi-layer membrane which fills up the empty space completely; the first multi-layer membranes and second multi-layer membrane having been united to form a united multi-layer membrane.

The present invention still further fifth provides a solid oxide fuel cell comprising a solid electrolyte capable of transmitting ions selectively, and an air pole provided on one side of the solid electrolyte and a fuel pole provided on the other side thereof, wherein;

the solid electrolyte comprises the ionic electrolyte membrane structure according to the above first embodiment or second embodiment.

Thus, the ionic electrolyte membrane structure according to the first embodiment comprises i) a substrate having a plurality of pores which have been made through the substrate in the thickness direction thereof and ii) a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate in such a way that the multi-layer membranes fill up the pores completely. The ions only are transmitted in the through direction, i.e., in the direction perpendicular to electrodes formed on both sides of the ionic electrolyte membrane, by way of the multi-layer membranes provided on the inner wall surfaces of the pores.

The ionic electrolyte membrane structure according to the second embodiment comprises a united multi-layer membrane comprising an ion conducting layer formed of an ion conductive material and an ion non-conducting layer formed of an ion non-conductive material which have alternately been formed in laminae a plurality of times. The united multi-layer membrane has been formed by i) bonding a substrate on one side thereof to a holding plate; the substrate being the substrate in the ionic electrolyte membrane structure according to the first embodiment, having the multi-layer membranes filling up the pores completely, ii) removing the substrate by dissolution to leave columnar multi-layer membranes to provide between the columnar multi-layer membranes an empty space extending through in the thickness direction of the structure to be formed, and iii) alternately forming in laminae a plurality of times an ion conducting layer formed of an ion conductive material and an ion non-conducting layer formed of an ion non-conductive material, by atomic layer deposition (ALD) on the inner wall surface of the empty space defined substantially by the columnar multi-layer membranes, serving as first multi-layer membranes, to form a second multi-layer membrane which fills up the empty space completely; the first multi-layer membranes and second multi-layer membrane having been united to form the united multi-layer membrane. The ions only are transmitted in the through direction, i.e., in the direction perpendicular to electrodes formed on both surfaces of the ionic electrolyte membrane structure, by way of the united multi-layer membrane formed.

Thus, these ionic electrolyte membrane structures are so structured that the edge faces of the interfaces between ion conducting layers and ion non-conducting layers which have alternately been formed in laminae on the pore inner wall surfaces or on the previous pore inner wall surfaces and the inner wall surface of the empty space defined substantially by the columnar multi-layer membranes stand bare on a plane, where the ions are transmitted in the through direction of the pores which have been made through the substrate or of the pores which had been made through the substrate and the space which had extended through between the columnar multi-layer membranes. Hence, the edge faces of the interfaces between ion conducting layers and ion non-conducting layers can be made into contact with the air pole and the fuel pole.

Accordingly, the use of any of these ionic electrolyte membrane structures in the SOFC enables the SOFC to be usable at a lower temperature, on account of its high ionic conductivity, so that the present ionic electrolyte membrane structure can be effective in that the range in which the SOFC with a superior energy efficiency is usable can be enlarged to a broader range inclusive of its use in general homes.

DESCRIPTION OF THE PREFERRED EMBODIMENTS

The present invention is described below in detail with reference to the accompanying drawings.

(1) Ion conductive material and ion non-conductive material:

In Non-patent Document 1, it discloses a laminated membrane in which YSZ (8 mol % of yttrium oxide $Y_2O_3$ is mixed) is used as an oxygen ion conductive material and STO (SrTiO$_3$) as an ion non-conductive material.

Figure 1:
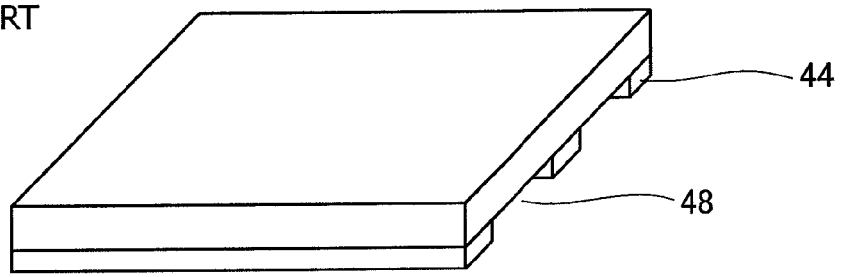
FIG. 1 is a schematic exploded perspective view of a conventional ionic electrolyte membrane structure (SOFC).
Figure 1:
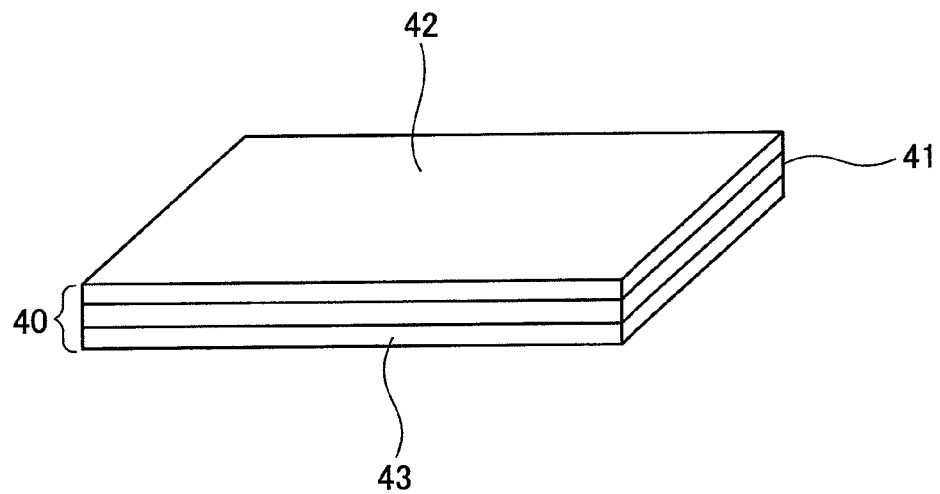
Figure 1:
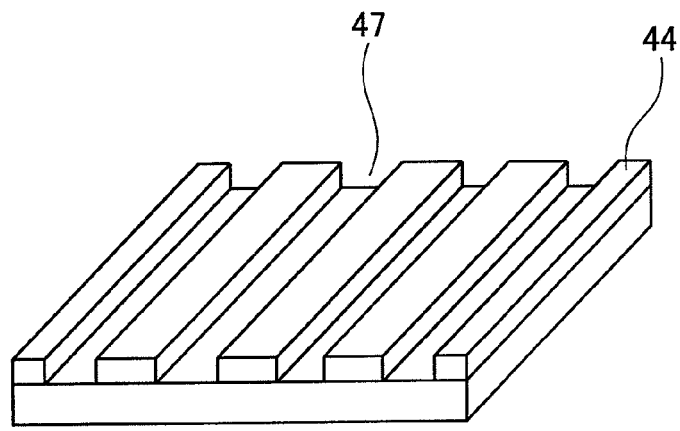
Figure 2:
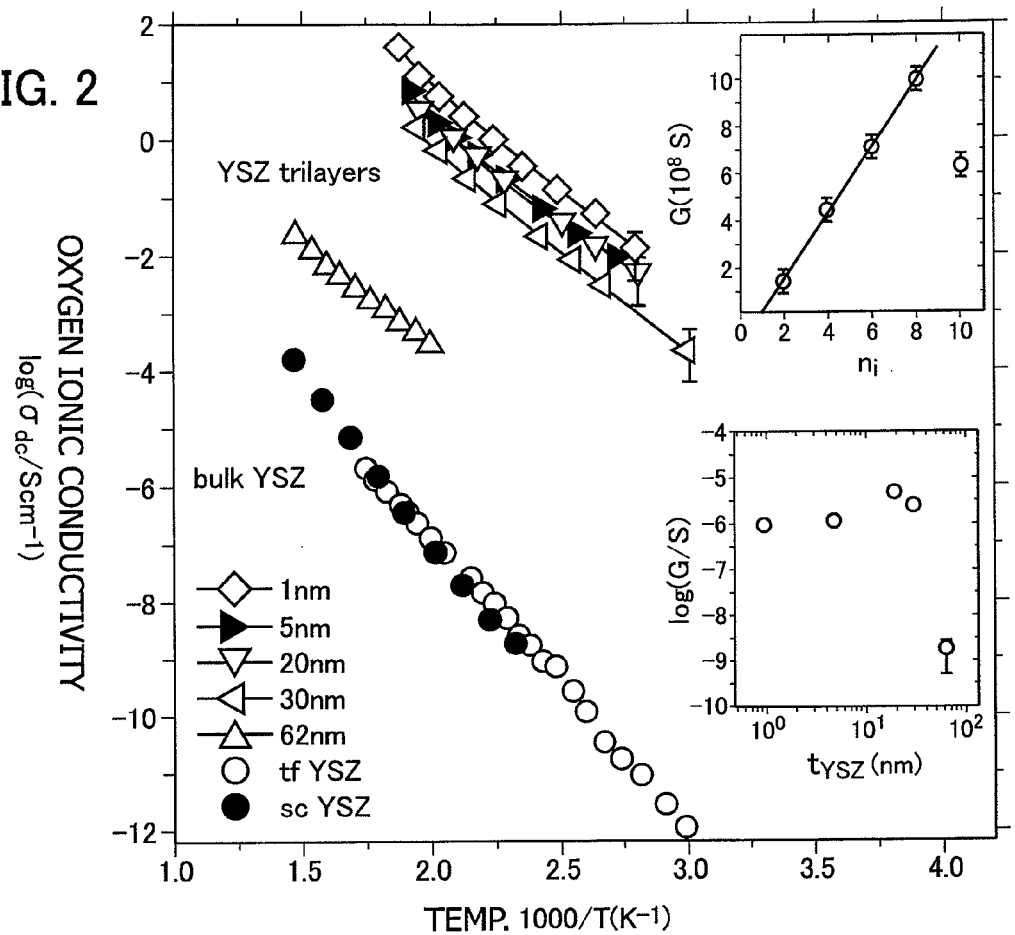
FIG. 2 is a graphical representation showing the relationship between ionic conductivity and temperature that is found when a laminated membrane in which YSZ (8 mol % of yttrium oxide is mixed) is used as an oxygen ion conductive material and STO ($SrTiO_3$) as an ion non-conductive material is formed in different layer thicknesses. A graphical representation at the upper column in the FIG. 2 graphical representation shows the relationship between the number of layers of the laminated membrane, $n_l$, and the ionic conductivity. A graphical representation at the lower column in the FIG. 2 graphical representation shows the relationship between the layer thickness of the laminated membrane, $t_{YSZ}$, and the ionic conductivity.

Its ionic conductivity measured when the laminated membrane is formed in different layer thicknesses has been examined, and results obtained are shown in the FIG. 2 graphical representation. The relationship between the number of layers of the laminated membrane and the ionic conductivity and the relationship between the layer thickness of the laminated membrane and the ionic conductivity have also been examined, and the relationship between the number of layers of the laminated membrane, $n_i$, and the ionic conductivity and the relationship between the layer thickness of the laminated membrane, $t_{YSZ}$, and the ionic conductivity are shown at the upper column and at the lower column, respectively, in the FIG. 2 graphical representation.

From the graphical representation showing "the relationship between the number of layers of the laminated membrane, $n_i$, and the ionic conductivity" shown at the upper column in the FIG. 2 graphical representation, it is seen that;

(i) the level of oxygen ionic conduction increases with an increase in the number of layers of the laminated membrane, and is proportional to the number of layers of the laminated membrane.

From the graphical representation showing "the relationship between the layer thickness of the laminated membrane, $t_{YSZ}$, and the ionic conductivity" shown at the lower column in the FIG. 2 graphical representation, it is also seen that;

(ii) the level of oxygen ionic conduction does not depend on the layer thickness of the laminated membrane.

From the groups of data of layer thicknesses 1 nm, 5 nm, 20 nm, 30 nm and 62 nm in the FIG. 2 graphical representation (see marks shown by squares, triangles and so forth), it is still also seen that;

(iii) the oxygen ionic conductivity is shown as ionic conductivity $\sigma > 1 \times 10$ S/cm in approximation, in the vicinity of T=200° C. (1,000/T=2.1).

In general, fuel cells are considered necessary for them to have an ionic conductivity of $\sigma > 1 \times 10^{-2}$ S/cm or more in solid electrolytes. Also, NAFION (trade name; available from Sigma-Aldrich Corporation), which is a proton (hydrogen ion) conducting membrane well-known as the PEFC, is known to have an ionic conductivity of $1 \times 10^{-2}$ to $3 \times 10^{-2}$ S/cm at a temperature between room temperature and 80° C.

Figure 3:
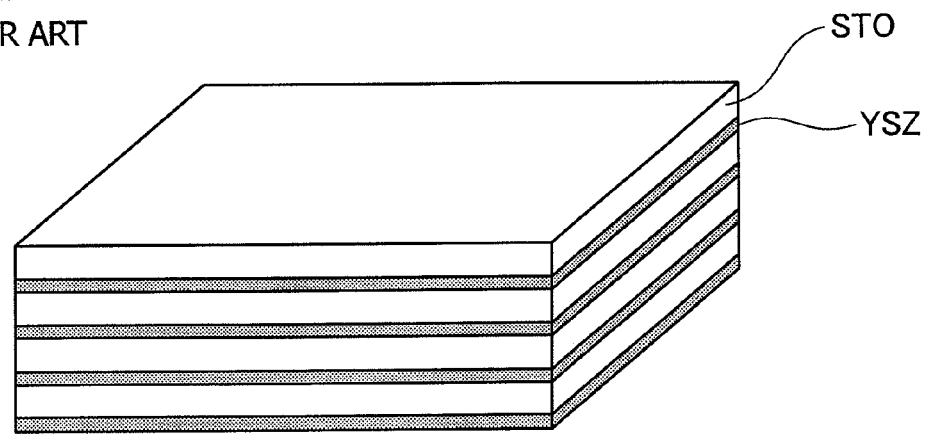
FIG. 3 is a schematic perspective view showing the structure of a conventional laminated membrane in which an ion conducting layer formed of YSZ and an ion non-conducting layer formed of STO are formed in laminae on a flat-plate substrate (not shown).
Figure 4:
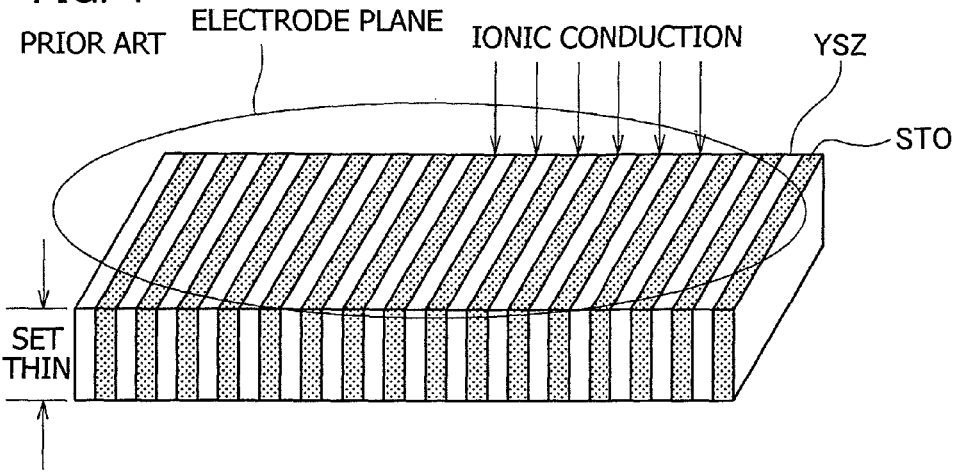
FIG. 4 is a schematic perspective view of a membrane lamination cross section obtained when the laminated membrane shown in FIG. 3 is cut in the direction perpendicular to the plane of that membrane.

Thus, the value of conductivity itself of the ion conductive material disclosed in Non-patent Document 1 can be said to be well attractive. However, the path of ionic conduction is bound to be the border (i.e., boundary or interface) between the YSZ layer and the STO layer. Hence, in a usual membrane forming method, a laminated membrane is obtained on a flat-plate substrate (not shown) which membrane is so structured as to be in parallel to the plane of this substrate, as shown in FIG. 3. As long as it is the laminated membrane structured as shown in FIG. 3, it follows that the border (i.e., boundary or interface) between each YSZ layer and each STO layer is present in parallel to the laminated membrane and the ions flow only in the direction parallel to the laminated membrane. In any of fuel cell electrolyte membranes, ion sensors and ion separation membranes where ionic conduction is utilized, the direction of ionic conduction must be the direction perpendicular to electrodes to be connected to the ionic electrolyte membrane. Accordingly, as long as the laminated membrane structured as shown in FIG. 3 is used, it comes necessary that the YSZ layer and the STO layer are formed in laminae to make up a laminated membrane having a thickness in the order of centimeters and this laminated membrane is cut in the direction perpendicular to the plane of the laminated membrane so that the borders (i.e., boundaries or interfaces) between YSZ layers and STO layers can be connected to an electrode on their cross sections as shown in FIG. 4. It, however, is impractical because it takes an astronomical time to form the YSZ layer and STO layer in laminae until they come to be in necessary thickness. In addition, it is desirable for the ionic electrolyte membrane to be as small as possible in layer thickness, and it is considered impossible for such a method as above to form the ionic electrolyte membrane in a thickness in the order of microns.

Figure 5:
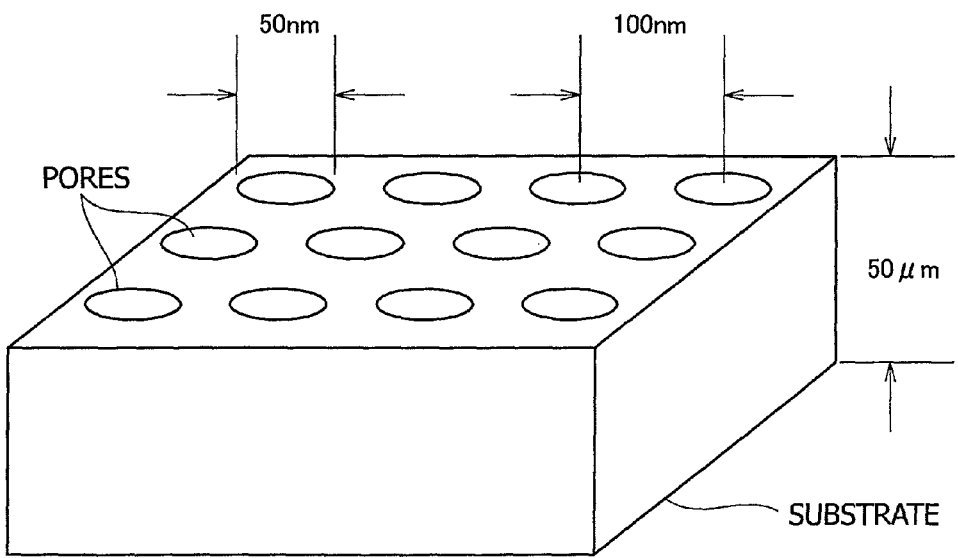
FIG. 5 is a schematic perspective view of a substrate used in the present invention and having a plurality of pores which have been made through the substrate in its thickness direction.
Figure 6:
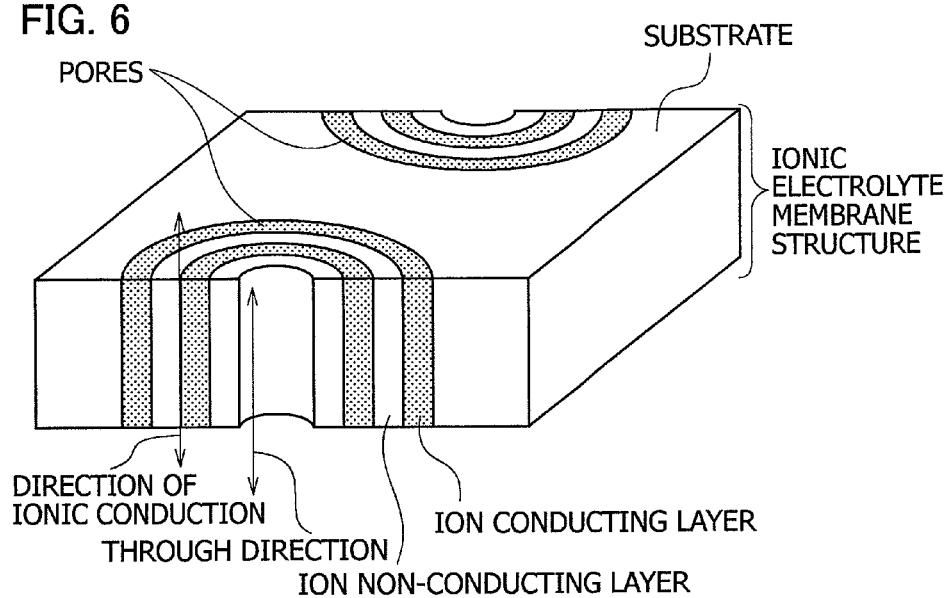
FIG. 6 is a schematic sectional perspective view of a partially enlarged part of the ionic electrolyte membrane structure according to the first embodiment of the present invention which structure is in the course of production (at a stage just before the pores of the substrate have completely been filled up with ion conducting layers and ion non-conducting layers).

(2) Ionic Electrolyte Membrane Structure:

The ionic electrolyte membrane structure according to the first embodiment of the present invention is constituted of i) a substrate having a plurality of pores which have been made through the substrate in the thickness direction thereof as shown in FIG. 5 and ii) a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate as shown in FIG. 6. These layers are alternately so formed in laminae that the multi-layer membranes fill up the pores completely (see FIG. 7). The ions only are transmitted in the through direction by way of the multi-layer membranes provided on the inner wall surfaces of the pores.

Figure 8:
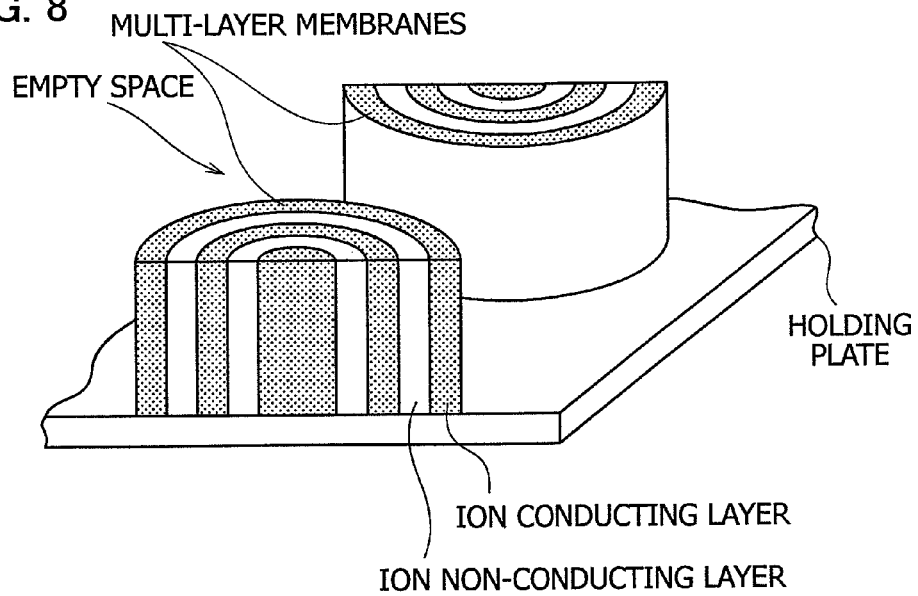
FIG. 8 is a schematic sectional perspective view of a partially enlarged part of the ionic electrolyte membrane structure according to the second embodiment of the present invention which structure is in the course of production (at a stage where the substrate of the ionic electrolyte membrane structure according to the first embodiment of the present invention has been removed to provide an empty space between columnar multi-layer membranes on a holding plate).
Figure 9:
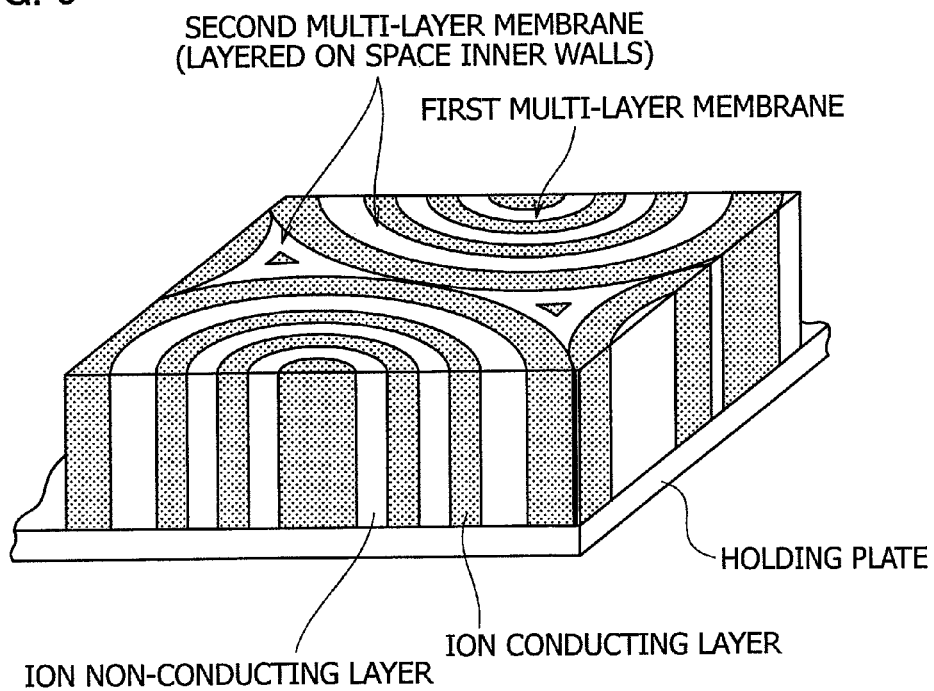
FIG. 9 is a schematic sectional perspective view of a partially enlarged part of the ionic electrolyte membrane structure according to the second embodiment of the present invention in which structure the empty space between columnar multi-layer membranes on a holding plate has completely been filled up with ion conducting layers and ion non-conducting layers.

The ionic electrolyte membrane structure according to the second embodiment of the present invention is constituted of a united multi-layer membrane comprising an ion conducting layer formed of an ion conductive material and an ion non-conducting layer formed of an ion non-conductive material which have alternately been formed in laminae a plurality of times. This united multi-layer membrane has been formed in the following way:

i) bonding a substrate on one side thereof to a holding plate. The substrate is the substrate in the ionic electrolyte membrane structure according to the first embodiment, having the multi-layer membranes filling up the pores completely (i.e., the substrate in an ionic electrolyte membrane structure comprising i) a substrate having a plurality of pores which have been made through the substrate in the thickness direction thereof and ii) a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate in such a way that the multi-layer membranes fill up the pores completely);

ii) thereafter removing the substrate by dissolution to leave columnar multi-layer membranes to provide between the columnar multi-layer membranes an empty space extending through in the thickness direction of the structure to be formed (i.e., an empty space formed between the columnar multi-layer membranes on the holding plate after the substrate portion has been removed, as shown in FIG. 8); and iii) thereafter alternately forming in laminae a plurality of times an ion conducting layer formed of an ion conductive material and an ion non-conducting layer formed of an ion non-conductive material on the inner wall surface of the empty space defined substantially by the columnar multi-layer membranes, serving as first multi-layer membranes, to form a second multi-layer membrane which fills up the empty space completely (see FIG. 9). The first multi-layer membranes and second multi-layer membrane have been united to form the united multi-layer membrane.

The ions only are transmitted in the through direction by way of the united multi-layer membrane formed.

The ionic electrolyte membrane structure is described below in detail.

(2-a) Substrate Having Pores:

In the substrate having a plurality of pores, i.e., the substrate having a plurality of pores which have been made through the substrate in its thickness direction, the pores are through holes and their size, period and so forth may artificially be controlled by nanoimprinting. As an example, an anodized aluminum substrate is described which may be used as the substrate. Aluminum may be anodized by, e.g., setting an aluminum plate as the anode, connecting carbon to the cathode and applying a voltage of approximately from several volts (V) to tens of volts (V) in the state both the electrodes are immersed in acid such as oxalic acid, where the surface of the aluminum plate is acceleratedly oxidized and pores of tens of nanometers (nm) in diameter are formed in self-alignment, vertically to the plate surface and in a depth in the order of millimeters (mm). Thereafter, setting the electrodes opposite, a voltage may be applied, where hydrogen gas is generated at the interface between the aluminum portion and the pore-formed portion, so that an oxide film can readily be peeled from the metallic surface. As an example, which depends on the voltage and the type of acid, a substrate can be obtained in which the through holes (pores) having size as shown in FIG. 5 (50 nm each in diameter and 100 nm in center-to-center distance) are formed in self-alignment.

Then, the ion conducting layer and the ion non-conducting layer are alternately formed in laminae on each inner wall surface of the pores, where, when each pore is 100 nm to 200 nm in diameter for example, the whole membrane formed as a laminated membrane is required to be about 50 to about 100 nm in thickness as measured from the center of each pore. Even where the size of area that is necessary for the laminated membrane itself is in the order of square centimeters, it follows that the time taken for the above layers to be formed in laminae on the inner wall surfaces of the pores standing in a large number through the substrate in its thickness direction can enough be a time for forming membranes of about 100 nm or about 200 nm. Thus, this can be a realistic and practical method. In the case when the aluminum plate is anodized, the area ratio found between the pore portions and the substrate portion (non-pore portion) on the top surface of the substrate is substrate portion (non-pore portion): pore portions=about 55:45. In the event that the ion conducting layer and the ion non-conducting layer are alternately formed in laminae on the pore inner wall surfaces until the multi-layer membranes fill up the pores completely, the area of an ionic conduction region comes to 45% of the whole top surface area of the substrate. That is, ionic conductivity with respect to the whole top surface of the substrate comes down to only about a half. Where the substrate in its whole top surface area is an ionic conductor at about 200° C. and its ionic conductivity is $1 \times 10^2$ S/cm, the former's ionic conductivity comes to only about $5 \times 10$ S/cm. Loss in ionic conductivity to such an extent does not matter, and it can be said that a sufficiently high ionic conductivity should have been secured.

(2-b) Oxygen Ion Conductive Material:

The oxygen ion conductive material making up an oxygen ion conducting layer may include at least one selected from YSZ (zirconium oxide stabilized with yttrium oxide), $LaGaO_3$, $CeO_2$, $SrFeO_{3-x}$, and $SrCoO_{3-x}$.

The YSZ is a typical one, but has a difficult point in that its working temperature is a high temperature of about 800° C. As a substitute therefor, a perovskite material typified by that of an $LaGaO_3$ series may be used. What is herein termed as "series" refers to the one in which, in place of La, it has partly been substituted with Sr or the one the Ga of which has partly been substituted with Mg or the like. Stated specifically, a perovskite series such as an $LaScO_3$ series is available, as exemplified by $(La,Sr)ScO_3$ and $SmSrCoO_3$. A $CeO_2$ series material is also a preferable material. Stated specifically, it may include $(Ce,Gd)O_2$. In place of a tetravalent material of the perovskite oxide, a trivalent material may also be doped as an acceptor in a proportion of 10% or less so as to be used as the following proton (hydrogen ion) conductive material.

(2-c) Proton (Hydrogen Ion) Conductive Material:

It is also preferable for the ion conducting layer to be formed of a proton (hydrogen ion) conductive material. The proton conductive material may preferably be a proton conductive material having a perovskite structure, and may preferably be at least one material selected from $BaCeO_3$, $SrCeO_3$, $BaZrO_3$ and $CeO_2$. In the $BaCeO_3$, it also includes one in which, in place of Ba, its part or the whole thereof has been substituted with Sr or Zr and part of Ce has been substituted with Zr or Y. The $CeO_2$ is also typical as the proton conductive material, which includes one in which part or the whole of Ce has been substituted with a rare earth element such as Sm.

(2-d) ALD (Atomic Layer Deposition):

The substrate used in the present invention has, as described above, a plurality of pores which have been made through the substrate in its thickness direction. The pores each have a diameter of from about 100 nm to about 200 nm, and the substrate has a thickness corresponding to the thickness the electrolyte has. Here, the resistance value of substantial ionic conduction decreases with an increase in thickness of the electrolyte, and hence the ionic conductor may preferably be smaller in thickness. If, however, its thickness is too small, there is a possibility that such membrane imperfectness unwantedly makes the fuel (such as hydrogen) and the oxygen come mixed directly, and hence its thickness must be so set that strength, reliability and conductivity may compromise with one another in accordance with the extent of proficiency in how to make it. In FIG. 5, the pore diameter is shown as 50 nm and the thickness as 50 µm. In actuality, it is preferable for the thickness to be set much smaller. As a method by which a membrane with a layer thickness of 10 nm or less is formed in laminae on the inner wall surfaces of the pores having such a large aspect ratio (ratio of pore length or depth to pore diameter), ALD (atomic layer deposition) is effective.

The ALD is a type of CVD processes, and is a process in which a substrate member is placed in a vacuum vessel (film forming system), a raw-material gas containing elements making up a molecular layer are fed into the vacuum vessel and the molecular layer is formed by the reaction taking place between molecules having adsorbed on the substrate surface or pore inner wall surfaces and a raw-material gas fed subsequently. This enables the layer thickness of the molecular layer to be controlled at the level of atomic layers, and is an optimum method for forming laminated membranes on the pore inner wall surfaces. Then, in the film forming system (atomic layer deposition system) used in the ALD, it is unnecessary to provide any expensive component part units, high-speed rotating mechanism and so forth which have been necessary in film forming systems used in PVD and CVD. Thus, this enables cost reduction for film formation, compared with conventional film forming processes.

In the method of forming a multi-layer membrane by ALD, a molecular layer for each of some kinds of substances different in values of physical properties is formed in laminae on the substrate surface or pore inner wall surfaces to form a thin membrane having the desired values of physical properties, and such a basic step is repeated a plurality of times to form a multi-layer membrane made up of some kinds of thin membranes. Then, in forming the respective thin membranes, raw-material gasses containing elements which are to make up respective molecular layers are alternately fed into the vacuum vessel (film forming system), and the number of times for replacing the raw-material gasses is controlled to make the respective thin membranes change continuously in composite values of physical properties.

In the ALD, many kinds of oxide layers or compound oxide layers like $SiO_2$, $Al_2O_5$, $Ta_2O_5$ and/or $TiO_2$ and/or nitride layers can be formed. Also, different substances may be deposited for several atomic layers to make a layer having new physical properties.

Where the ALD is used to form, e.g., an $Al_2O_3$ mono-atomic layer (monomolecular layer), the process is completed through the following four steps.

(1) Water molecules are introduced to make OH groups adsorbed on the substrate surface or pore inner wall surfaces or on any surface(s) on which a membrane or membranes has or have already been formed.

(Reaction for First Layer Downward)

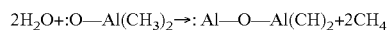

$$2H_2O+:O{-}Al(CH_3)_2 \rightarrow :Al{-}O{-}Al(CH)_2+2CH_4$$

(2) Any excess water molecules are purged to effect evacuation.

(3) TMA [trimethyl aluminum: $Al(CH_3)_3$] gas, a raw-material gas for the $Al_2O_3$ membrane, is introduced. TMA molecules react with the OH groups to generate $CH_4$ gas.

(Reaction for First Layer)

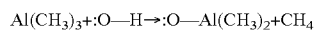

$$Al(CH_3)_3+:O{-}H \rightarrow :O{-}Al(CH_3)_2+CH_4$$

(Reaction for First Layer Downward)

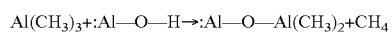

$$Al(CH_3)_3+:Al{-}O{-}H \rightarrow :Al{-}O{-}Al(CH_3)_2+CH_4$$

(4) The $CH_4$ gas purged to effect evacuation.

Through these four steps, an $Al_2O_3$ membrane of about 0.1 nm is formed, and hence the above four steps are repeated to increase its layer thickness until it comes to have the desired layer thickness.

Figure 7:
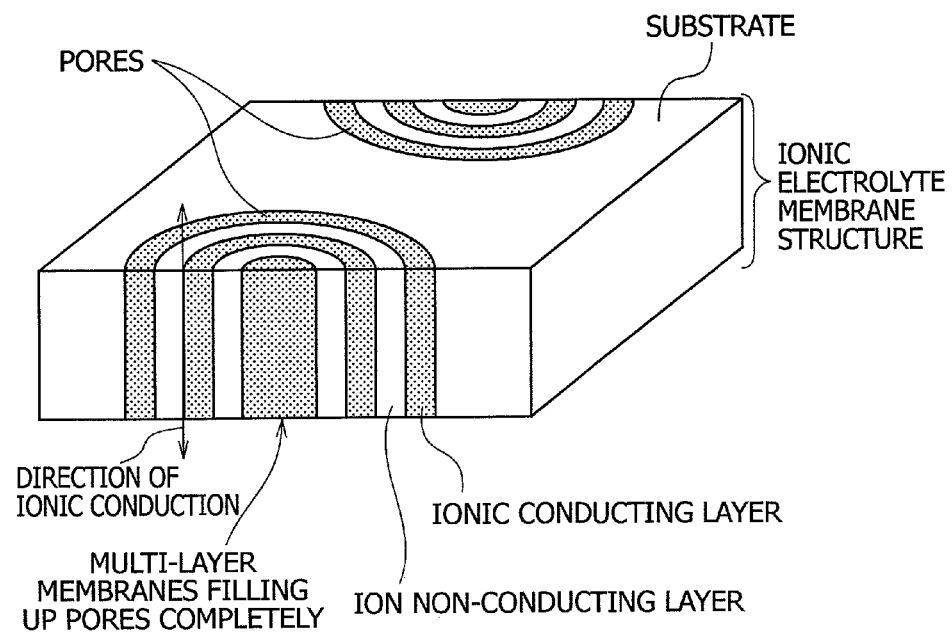
FIG. 7 is a schematic sectional perspective view of a partially enlarged part of the ionic electrolyte membrane structure according to the first embodiment of the present invention (Example 1) in which structure the pores of the substrate have completely been filled up with ion conducting layers and ion non-conducting layers.

In the method for producing the ionic electrolyte membrane structure according to the first embodiment of the present invention, the ion conducting layer formed of an ion conductive material and the ion non-conducting layer formed of an ion non-conductive material are alternately formed in laminae a plurality of times by the ALD on each inner wall surface of the holes of the substrate having a plurality of pores which have been made through the substrate in its thickness direction, to form the multi-layer membranes which fill up the pores completely with ion conducting layers and ion non-conducting layers, as shown in FIG. 7. Thus, the ionic electrolyte membrane structure according to the first embodiment of the present invention is obtained in which the ions only are transmitted in the through direction by way of the multi-layer membranes thus formed.

Incidentally, in the ionic electrolyte membrane structure according to the first embodiment of the present invention, obtained by using the ALD, the multi-layer membranes made up of ion conducting layers and ion non-conducting layers stand formed not only on the pore inner wall surfaces but also on the plane surface of the substrate. Accordingly, in order to connect the resultant ionic electrolyte membrane structure to electrodes (the air pole and the fuel pole), the multi-layer membrane formed on the plane surface of the substrate must be removed by a mechanical means, e.g., by grinding to make the edge faces of the interfaces between ion conducting layers and ion non-conducting layers stand bare to the surface.

Here, as the ion conductive material, the oxygen ion conductive material or proton (hydrogen ion) conductive material described above may be used.

As the ion non-conductive material, usable are oxides of various types, such as STO ($SrTiO_3$). It may appropriately be selected taking account of an affinity for the above ion conductive material, i.e., taking account of coefficient of thermal expansion, lattice constant, crystal structure and so forth.

Now, in the ionic electrolyte membrane structure according to the first embodiment of the present invention, what is utilized is that the ions are conducted through the interfaces between layers of the multi-layer membranes provided on the pore inner wall surfaces and through the ion conducting layers of the same. Here, what should most direct attention to is that, if, in the course the ionic electrolyte membrane structure is produced, any new fine through holes are formed in the substrate or the pore inner wall surfaces are not completely filled up with the multi-layer membranes, a difficulty may arise such that the fuel gas and the oxygen gas come directly mixed when the ionic electrolyte membrane structure is set in a fuel cell. Accordingly, after the pore inner wall surfaces have been judged to have completely been filled up with the multi-layer membranes, it is desirable to form one ion conducting layer as the last one membrane, taking account of such a difficulty.

Next, the ionic electrolyte membrane structure according to the second embodiment of the present invention may be produced in the following way, by using the ALD.

The substrate is, on one side thereof, bonded to a holding plate; the substrate being that in the ionic electrolyte membrane structure according to the first embodiment of the present invention as described above, made up of i) the substrate having a plurality of pores which have been made through the substrate in its thickness direction and ii) the multi-layer membranes each comprising the ion conducting layer and the ion non-conducting layer which have alternately been formed in laminae a plurality of times on each inner wall surface of the pores of the substrate in such a way that the multi-layer membranes fill up the pores completely. Then, preferably after the multi-layer membrane formed inevitably on the plane surface of the substrate in the ionic electrolyte membrane structure of the first embodiment has been removed by a mechanical means, e.g., by grinding, the substrate portion is removed by dissolution to leave columnar multi-layer membranes to provide between the columnar multi-layer membranes an empty space (i.e., an empty space formed between the columnar multi-layer membranes on the holding plate after the substrate portion has been removed) extending through in the thickness direction of the structure to be formed, as shown in FIG. 8.

Next, the ion conducting layer formed of an ion conductive material and the ion non-conducting layer formed of an ion non-conductive material are alternately formed in laminae a plurality of times as shown in FIG. 9, by the ALD on the inner wall surface of the empty space defined substantially by the columnar multi-layer membranes, serving as first multi-layer membranes, to form a second multi-layer membrane which fills up the empty space completely. Thus, the first multi-layer membranes and second multi-layer membrane have been united to form the united multi-layer membrane to obtain the ionic electrolyte membrane structure in which the ions only are transmitted in the through direction by way of the united multi-layer membrane formed.

Incidentally, as stated previously, in the ionic electrolyte membrane structure according to the first embodiment of the present invention, obtained by using the ALD, the multi-layer membranes made up of ion conducting layers and ion non-conducting layers stand formed not only on the pore inner wall surfaces but also on the plane surface of the substrate. Accordingly, it is preferable that the multi-layer membrane formed on the plane surface of the substrate in the ionic electrolyte membrane structure of the first embodiment is removed by a mechanical means, e.g., by grinding, to make the plane surface of the substrate stand bare to the surface, thereafter the substrate portion (alumina portion) is removed by dissolution using a chromium-phosphoric acid liquid mixture or the like to provide the empty space extending through in the thickness direction of the structure to be formed and subsequently the above ALD is carried out.

In the ionic electrolyte membrane structure according to the second embodiment of the present invention, in which the ions are transmitted in the through direction by way of the united multi-layer membrane made up of the first multi-layer membranes and second multi-layer membrane, as compared with the ionic electrolyte membrane structure according to the first embodiment of the present invention, in which the ions are transmitted in the through direction by way of only the multi-layer membranes provided on the pore inner wall surfaces, the second multi-layer membrane provided on the inner wall surface of the empty space formed by removing the substrate portion is also utilized. In virtue of such an additional portion, the service area as the electrolyte membrane comes to 100%. Thus, different from the ionic electrolyte membrane structure according to the first embodiment of the present invention, it in principle does not come about that the value of ionic conductivity comes small.

In the ionic electrolyte membrane structure according to the second embodiment of the present invention, too, in order to connect it to electrodes (the air pole and the fuel pole), the edge faces of the interfaces of the columnar first multi-layer membranes, which had been provided on the pore inner wall surfaces, and the edge faces of the interfaces between layers of the second multi-layer membrane provided on the inner wall surface of the empty space defined substantially by the columnar multi-layer membranes must be made to stand bare to the surface.

In the ionic electrolyte membrane structures according to the first embodiment and second embodiment of the present invention, it is preferable that each layer of the ion conducting layers and ion non-conducting layers formed respectively on the pore inner wall surfaces or on the previous hole inner wall surfaces and the inner wall surface of the empty space defined substantially by the columnar multi-layer membranes is in a layer thickness of from 1 atomic layer or more to 10 nm or less. As long as it is 10 nm or less, the number of the interfaces between ion conducting layers and ion non-conducting layers can be made large as being preferable. Here, where the substrate used has pores of about 1 pm in diameter, the layer thickness of multi-layer membranes each is required to correspond to the pore diameter after all. Formation of such multi-layer membranes takes too long time to be realistic and practical. Hence, it is preferable for the pores to be about 100 nm in diameter. In this case, conduction paths increase with an increase in the number of the membrane to be formed in laminae, and hence it is desirable for the layer thickness of each membrane of the multi-layer membrane to be not more than 10 nm. This is because, if the layer thickness of each membrane is more than 10 nm, the number of the membrane to be formed in laminae decreases correspondingly and the number of interfaces decreases, resulting in a smaller number of the conduction paths.

(3) Solid Oxide Fuel Cell (SOFC):

The solid oxide fuel cell (SOFC) according to the present invention comprises a solid electrolyte capable of transmitting ions selectively, and an air pole provided on one side of the solid electrolyte and a fuel pole provided on the other side thereof, and is characterized in that the solid electrolyte comprises the ionic electrolyte membrane structure according to the first embodiment or second embodiment of the present invention, described above.

The ionic electrolyte membrane structure according to the first embodiment or second embodiment of the present invention is so structured that the edge faces of the interfaces between ion conducting layers and ion non-conducting layers which have alternately been formed in laminae on the pore inner wall surfaces or on the previous pore inner wall surfaces and the inner wall surface of the empty space defined substantially by the columnar multi-layer membranes stand bare on a plane, where the ions are transmitted in the through direction of the pores which have been made through the substrate or of the pores which had been made through the substrate and the space which had extended through between the columnar multi-layer membranes. Hence, the edge faces of the interfaces between ion conducting layers and ion non-conducting layers can be made into contact with the air pole and the fuel pole.

Accordingly, in the solid oxide fuel cell (SOFC) having the ionic electrolyte membrane structure according to the first embodiment or second embodiment of the present invention, the SOFC is usable at a lower temperature in virtue of the high ionic conductivity the ionic electrolyte membrane structure has, so that the range in which the SOFC with a superior energy efficiency is usable can be enlarged to a broader range inclusive of its use in general homes.

The present invention is described below in greater detail by giving Examples.

EXAMPLE 1

A 30 µm thick alumina substrate obtained by anodizing an aluminum plate and having pores (100 nm in diameter) as through holes in the thickness direction of the substrate, standing open over the whole surface thereof, was used as a substrate of an ionic electrolyte membrane structure according to Example 1. Then, YSZ (8 mol % of $Y_2O_3$ was mixed) was used as an ion conductive material and STO ($SrTiO_3$) as an ion non-conductive material, and the YSZ and the STO were alternately deposited in laminae by ADL on each inner wall surface of the pores in such a way that the layers were each 5 nm in thickness and the multi-layer membranes thus formed filled up the pores completely.

Stated more specifically, the alumina substrate was fastened onto a stand with a heater, placed in a vacuum chamber, and the alumina substrate was kept at 250° C. while evacuating the inside of the vacuum chamber.

In the course of the foregoing, a raw material for $Y_2O_3$ (yttrium trimethylcyclopentadienyl: $YCpMe_3$ as reaction product A) was mixed with a raw material for $Zr_2O_3$ [zirconium tetratertiary butoxide: $Zr(O^tBu)_4$ as reaction product B] in a molar ratio of 8% based on the latter, and these were fed into the vacuum chamber for 100 mili-second to form a YSZ membrane. Thereafter, a purging gas shown in Table 1 was fed into the vacuum chamber for 2 seconds to purge any unreacted gas remaining at the first stage. Thereafter, the above step of forming the YSZ membrane was repeatedly carried out by 10 times in total to make the membrane have a thickness of about 5 nm.

Next, strontium dicyclopentadenyltripropyl [$Sr(CpPr_3)_2$ as reaction product A] was mixed with titanium methoxide [$Ti(OMe)_4$ as reaction product B] and these were fed into the vacuum chamber at a flow rate of 100 m/second to form an STO membrane. Thereafter, a purging gas shown in Table 1 was fed into the vacuum chamber for 2 seconds to purge any unreacted gas remaining at the second stage. This step was repeatedly carried out by 10 times in total to make the membrane have a thickness of about 5 nm.

The foregoing steps as a whole were taken as one set, and repeatedly carried out by five sets in total to form the YSZ membrane and the STO membrane in laminae on the inner wall surfaces of the above pores of 100 nm in diameter substantially in parallel thereto and in the form of concentric circles. These steps were completed at the time the multi-layer membranes fill up the pores completely.

The multi-layer membrane product was, on its substrate both sides, surface-abraded by reverse sputtering until the edge faces of interfaces of the multi-layer membranes came to appear which were formed in laminae on the inner wall surfaces of the pores of 100 nm in diameter in the form of concentric circles, to obtain the ionic electrolyte membrane structure according to Example 1.

The ionic electrolyte membrane structure according to Example 1 thus obtained is diagrammatically shown in FIG. 7. The raw-material gases for the ion conductive material and ion non-conductive material and the purging gases as used in the ALD are also shown in Table 1 below.

TABLE 1

|  | Reaction product A | Purging gas | Reaction product B | Purging gas |
|---|---|---|---|---|
| YSZ | $YCpMe_3$ | $N_2$ | $Zr(O^tBu)_4$ | $N_2$ |
| $SrTiO_3$ | $Sr(CpPr_3)_2$ | $N_2$ | $Ti(OMe)_4$ | $N_2$ |

Here, Cp: a cyclopentadienyl; $(O^tBu)_4$ and $(OMe)_4$: alkoxides such as butoxyl and methoxyl groups; and Pr: a propyl group.

The oxygen ionic conductivity of the ionic electrolyte membrane structure obtained was measured with impedance analyzer (Solatron-1260) according to the standard measuring method: JIS-R-1661 to find that a high ionic conductivity of $1\times10$ S/cm was obtained at T=200° C.

EXAMPLE 2

An ionic electrolyte membrane structure according to Example 2 was obtained in the same way as in Example 1 except that the YSZ used as the ion conductive material in Example 1 was changed for $LaGaO_3$.

The raw-material gases for the ion conductive material and ion non-conductive material and the purging gases as used in the ALD are shown in Table 2 below.

TABLE 2

|  | Reaction product A | Purging gas | Reaction product B | Purging gas |
|---|---|---|---|---|
| $LaGaO_3$ | $La(thd)_3$ | $N_2$ | $GaCl_3$ | $O_2$ |
| $SrTiO_3$ | $Sr(CpPr_3)_2$ | $N_2$ | $Ti(OMe)_4$ | $N_2$ |

$(thd)_3$: tri-tetramethyl-heptanedionate.

The oxygen ionic conductivity of the ionic electrolyte membrane structure obtained was measured to find that a high ionic conductivity of $5\times10^{-1}$ S/cm was obtained at T=200° C.

EXAMPLE 3

An ionic electrolyte membrane structure according to Example 3 was obtained in the same way as in Example 1 except that the YSZ used as the ion conductive material in Example 1 was changed for $CeO_2$.

The raw-material gases for the ion conductive material and ion non-conductive material and the purging gases as used in the ALD are shown in Table 3 below.

TABLE 3

|  | Reaction product A | Purging gas | Reaction product B | Purging gas |
|---|---|---|---|---|
| $CeO_2$ | $Ce(thd)_4$ | $N_2$ | $O_2$ | $N_2$ |
| $SrTiO_3$ | $Sr(CpPr_3)_2$ | $N_2$ | $Ti(OMe)_4$ | $N_2$ |

$(thd)_4$: tetra-tetramethyl-heptanedionate.

The oxygen ionic conductivity of the ionic electrolyte membrane structure obtained was measured to find that a high ionic conductivity of $2\times10^{-1}$ S/cm was obtained at T=200° C.

EXAMPLE 4

A 30 μm thick alumina substrate obtained by anodizing an aluminum plate and having pores (100 nm in diameter) as through holes in the thickness direction of the substrate, standing open over the whole surface thereof, was used as a substrate of an ionic electrolyte membrane structure according to Example 4. Then, $BaCeO_3$ was used as an ion conductive material and STO ($SrTiO_3$) as an ion non-conductive material, and the $BaCeO_3$ and the STO were alternately deposited in laminae by ADL on each inner wall surface of the pores in such a way that the layers were each 5 nm in thickness and the multi-layer membranes thus formed filled up the pores completely.

Stated more specifically, the alumina substrate was fastened onto a stand with a heater, placed in a vacuum chamber, and the alumina substrate was kept at 250° C. while evacuating the inside of the vacuum chamber.

Except using the above materials, the subsequent procedure of Example 1 was repeated by the ALD and under the like conditions.

The raw-material gases for the ion conductive material and ion non-conductive material and the purging gases as used in the ALD are shown in Table 4 below.

TABLE 4

|  | Reaction product A | Purging gas | Reaction product B | Purging gas |
|---|---|---|---|---|
| $BaCeO_3$ | $Ba(OEt)_3$ | $N_2$ | $Ce(thd)_4$ | $O_2$ |
| $SrTiO_3$ | $Sr(CpPr_3)_2$ | $N_2$ | $Ti(OMe)_4$ | $N_2$ |

$(OEt)_3$: an ethoxyl group.

The proton (hydrogen ion) ionic conductivity of the ionic electrolyte membrane structure obtained was measured to find that a value of $\sigma=1\times10^{-2}$ S/cm was obtained at T=650° C.

EXAMPLE 5

An ionic electrolyte membrane structure according to Example 5 was obtained in the same way as in Example 4 except that the BaCeO$_3$ used as the ion conductive material in Example 4 was changed for SrCeO$_3$.

The raw-material gases for the ion conductive material and ion non-conductive material and the purging gases as used in the ALD are shown in Table 5 below.

TABLE 5

|  | Reaction product A | Purging gas | Reaction product B | Purging gas |
|---|---|---|---|---|
| SrCeO$_3$ | Sr(CpPr$_3$)$_2$ | N$_2$ | Ce(thd)$_4$ | O$_2$ |
| SrTiO$_3$ | Sr(CpPr$_3$)$_2$ | N$_2$ | Ti(OMe)$_4$ | N$_2$ |

(CpPr$_3$)$_2$: Cp: a cyclopentadienyl group, Pr: a propyl group.

The proton (hydrogen ion) ionic conductivity of the ionic electrolyte membrane structure obtained was measured to find that a value of $\sigma=8\times10^{-3}$ S/cm was obtained at T=650° C.

EXAMPLE 6

An ionic electrolyte membrane structure according to Example 6 was obtained in the same way as in Example 4 except that the BaCeO$_3$ used as the ion conductive material in Example 4 was changed for BaZrO$_3$.

The raw-material gases for the ion conductive material and ion non-conductive material and the purging gases as used in the ALD are shown in Table 6 below.

TABLE 6

|  | Reaction product A | Purging gas | Reaction product B | Purging gas |
|---|---|---|---|---|
| BaZrO$_3$ | Ba(OEt)$_3$ | N$_2$ | ZrCl$_4$ | N$_2$ |
| SrTiO$_3$ | Sr(CpPr$_3$)$_2$ | N$_2$ | Ti(OMe)$_4$ | N$_2$ |

The proton (hydrogen ion) ionic conductivity of the ionic electrolyte membrane structure obtained was measured to find that a large value of $\sigma=9\times10^{-3}$ S/cm was shown at T=650° C.

EXAMPLE 7

An ionic electrolyte membrane structure according to Example 7 was obtained in the same way as in Example 4 except that the BaCeO$_3$ used as the ion conductive material in Example 4 was changed for CeO$_2$.

The raw-material gases for the ion conductive material and ion non-conductive material and the purging gases as used in the ALD are shown in Table 7 below.

TABLE 7

|  | Reaction product A | Purging gas | Reaction product B | Purging gas |
|---|---|---|---|---|
| CeO$_2$ | Ce(thd)$_4$ | N$_2$ | O$_2$ | N$_2$ |
| SrTiO$_3$ | Sr(CpPr$_3$)$_2$ | N$_2$ | Ti(OMe)$_4$ | N$_2$ |

The proton (hydrogen ion) ionic conductivity of the ionic electrolyte membrane structure obtained was measured to find that a value of $\sigma=4\times10^{-3}$ S/cm was shown at T=650° C.

EXAMPLE 8

To one side of the substrate in the ionic electrolyte membrane structure according to Example 1 as shown in FIG. 7, a Pt thin plate which was to serve as an electrode was bonded with a silver paste. Then, the substrate was, on the other side thereof, slightly scratched with sandpaper, and thereafter the alumina portion (substrate portion) was removed by dissolution using a chromium-phosphoric acid liquid mixture to leave columnar multi-layer membranes to provide between the columnar multi-layer membranes an empty space extending through in the thickness direction of the structure to be formed (i.e., an empty space formed between the columnar multi-layer membranes on the Pt thin plate after the alumina portion was removed as shown in FIG. 8).

Next, in the same way as in Example 1 that the YSZ and the STO were alternately deposited in laminae by ADL on each inner wall surface of the pores, YSZ and STO were further alternately deposited in laminae on the inner wall surface of the empty space defined substantially by the columnar multi-layer membranes, where their deposition was stopped at the time the multi-layer membranes came to fill up the empty space completely. Thus, it was able to form ionic electrolyte membranes over the whole area of the structure.

The oxygen ionic conductivity of the ionic electrolyte membrane structure obtained was measured to find that a large value of $\sigma=7\times10^1$ S/cm was shown at T=200° C.

EXAMPLE 9

The ionic electrolyte membrane structure produced in Example 8 was used to produce an SOFC electrolyte layer.

Stated specifically, the back surface of the above ionic electrolyte membrane structure was partly removed by rubbing with sandpaper. Thereafter, an NiO porous substrate was used as the anode and an SmCoO$^3$ oxide as the cathode, and the material member obtained was baked at 500° C. to produce a solid oxide fuel cell (SOFC).

Next, hydrogen was fed to the fuel pole side and air to the oxygen pole side to test the generation of electricity at 200° C. Electricity generation characteristics were measured by a four-terminal method according to JIS-R-1661.

Figure 10:
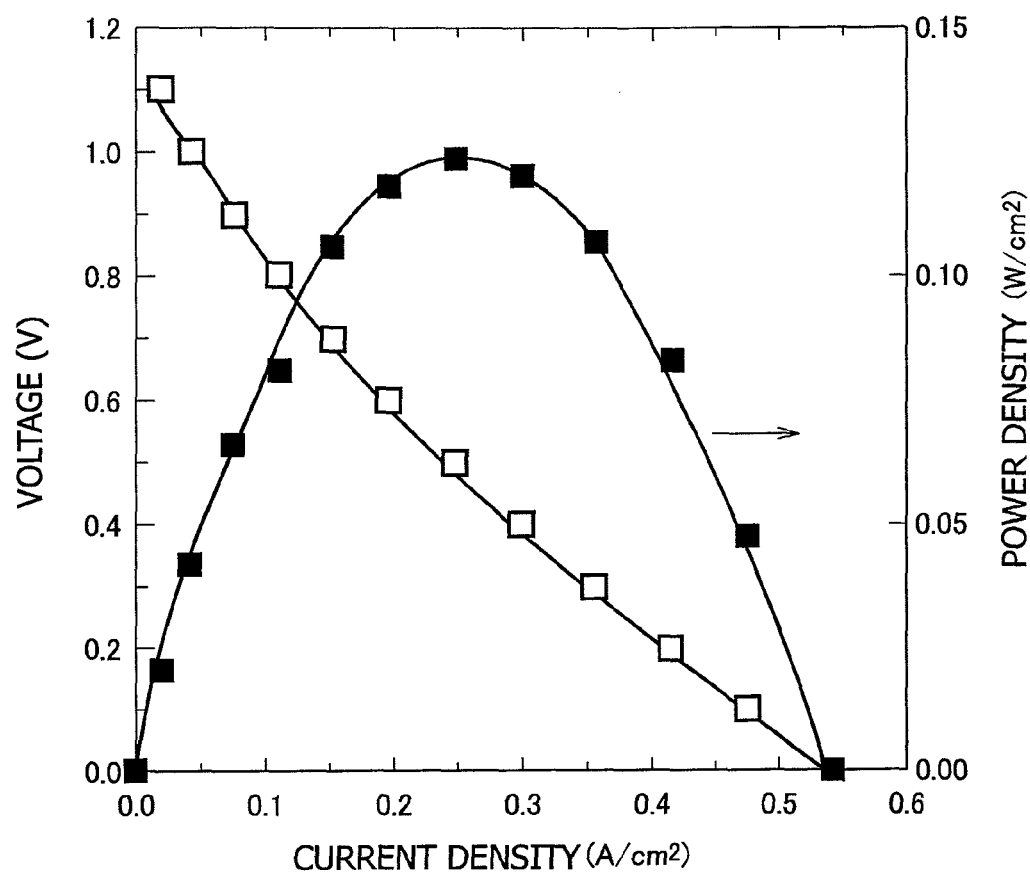
FIG. 10 is a graphical representation showing electricity generation characteristics at 200° C. of a solid oxide fuel cell according to Example 9.

Voltage, current density and power density measured thereby were as shown in FIG. 10.

POSSIBILITY OF INDUSTRIAL APPLICATION

The ionic electrolyte membrane structure according to the present invention is so structured that the edge faces of the interfaces between ion conducting layers and ion non-conducting layers which have alternately been formed in laminae on the pore inner wall surfaces or on the previous pore inner wall surfaces and the inner wall surface of the empty space defined substantially by the columnar multi-layer membranes stand bare on a plane, where the ions are transmitted in the through direction of the pores which have been made through the substrate or of the pores which had been made through the substrate and the space which had extended through between the columnar multi-layer membranes. Hence, the edge faces of the interfaces between ion conducting layers and ion non-conducting layers can be made into contact with the air pole and the fuel pole. Thus, it has a possibility of industrial application that it is usable as the solid electrolyte of a solid oxide fuel cell (SOFC) having a superior energy efficiency.

What is claimed is:

1. An ionic electrolyte membrane structure which transmits ions only, comprising:
    a substrate having a plurality of pores which have been made through the substrate in the thickness direction thereof; and
    a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate in such a way that the multi-layer membranes fill up the pores completely;

the ions only being transmitted in the through direction by way of the multi-layer membranes provided on the inner wall surfaces of the pores.

2. The ionic electrolyte membrane structure according to claim 1, wherein each layer of the ion conducting layer and ion non-conducting layer is in a layer thickness of from 1 atomic layer or more to 10 nm or less.

3. The ionic electrolyte membrane structure according to claim 1, wherein the ions to be transmitted in the through direction by way of the multi-layer membranes formed are oxygen ions.

4. The ionic electrolyte membrane structure according to claim 1, wherein the ion conducting layer is formed of an oxygen ion conductive material, and the oxygen ion conductive material is at least one selected from YSZ, $LaGaO_3$, $CeO_2$, $SrFeO_3$, and $SrCoO_{3-x}$.

5. The ionic electrolyte membrane structure according to claim 1, wherein the ions to be transmitted in the through direction by way of the multi-layer membranes formed are hydrogen ions.

6. The ionic electrolyte membrane structure according to claim 1, wherein the ion conducting layer is formed of a hydrogen ion conductive material having perovskite structure.

7. The ionic electrolyte membrane structure according to claim 6, wherein the hydrogen ion conductive material having perovskite structure is at least one material selected from $BaCeO_3$, $SrCeO_3$, $BaZrO_3$ and $CeO_2$.

8. A solid oxide fuel cell comprising a solid electrolyte capable of transmitting ions selectively, and an air pole provided on one side of the solid electrolyte and a fuel pole provided on the other side thereof, wherein;

the solid electrolyte comprises an ionic electrolyte membrane structure which transmits ions only, comprising:

a substrate having a plurality of pores which have been made through the substrate in the thickness direction thereof; and a plurality of multi-layer membranes each comprising an ion conducting layer formed of an ion conductive material and an ion non-conducting layer formed of an ion non-conductive material which have alternately been formed in laminae a plurality of times on each inner wall surface of the pores of the substrate in such a way that the multi-layer membranes fill up the pores completely;

the ions only being transmitted in the through direction by way of the multi-layer membranes provided on the inner wall surfaces of the pores.

* * * * *